(12) United States Patent
Sharma

(10) Patent No.: US 7,041,598 B2
(45) Date of Patent: May 9, 2006

(54) DIRECTIONAL ION ETCHING PROCESS FOR PATTERNING SELF-ALIGNED VIA CONTACTS

(75) Inventor: Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 298 days.

(21) Appl. No.: 10/606,263

(22) Filed: Jun. 25, 2003

(65) Prior Publication Data

US 2004/0266179 A1 Dec. 30, 2004

(51) Int. Cl.
*H01L 21/44* (2006.01)

(52) U.S. Cl. ..................................... 438/673
(58) Field of Classification Search ............... 438/740, 438/735, 723, 714, 711, 710, 705, 637, 464, 438/3, 687, 653, 655, 620; 250/125; 257/295
See application file for complete search history.

(56) References Cited

U.S. PATENT DOCUMENTS

| | | | |
|---|---|---|---|
| 4,182,636 A | 1/1980 | Dennard et al. | |
| 5,106,461 A * | 4/1992 | Volfson et al. | 205/125 |
| 5,512,514 A | 4/1996 | Lee | |
| 6,309,957 B1 | 10/2001 | Tu et al. | |
| 6,391,658 B1 * | 5/2002 | Gates et al. | 438/3 |
| 6,498,092 B1 | 12/2002 | Lee et al. | |

* cited by examiner

*Primary Examiner*—David Blum
*Assistant Examiner*—Monica D. Harrison

(57) ABSTRACT

The invention provides a directional ion etching process to pattern self-aligned via contacts in the manufacture of semiconductor devices such as high density magnetic random access memory (MRAM). In a particular embodiment, a semiconductor wafer is prepared with vertically arranged layers, including a patterned layer in electrical contact with a conductive row layer. The patterned layer may be a magnetic tunnel junction layer. A photoresist is deposited on the junction layer, masked, exposed and developed. The non-protected junction layer is etched to provide appropriate junction stacks. The remaining photoresist caps are not dissolved, rather they and the surface of the wafer are coated with a dielectric. Directional ion etching at a low angle relative to the junction stack layer removes the coated photoresist caps and thereby provides at least one patterned self-aligned via contact.

38 Claims, 7 Drawing Sheets

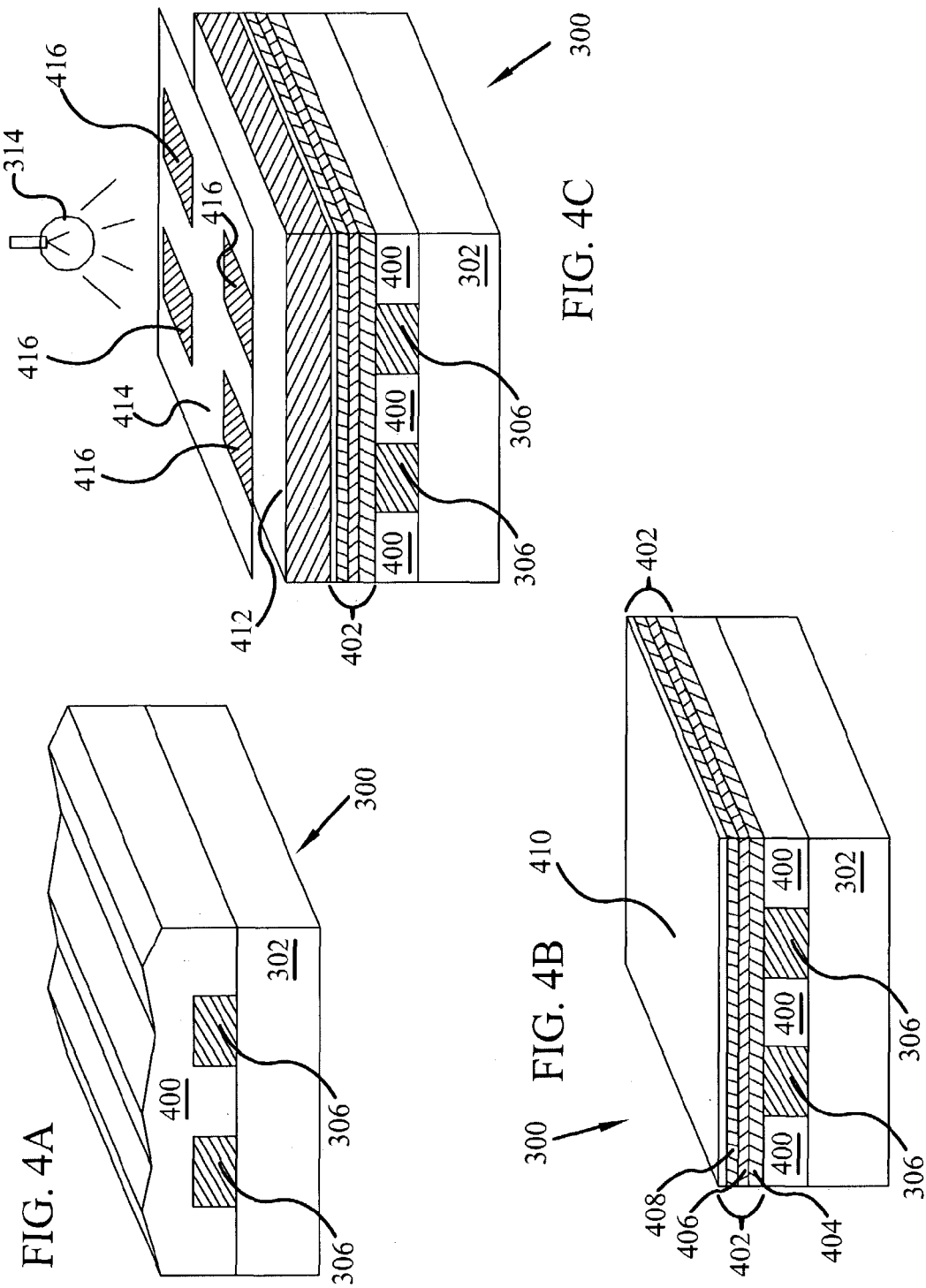

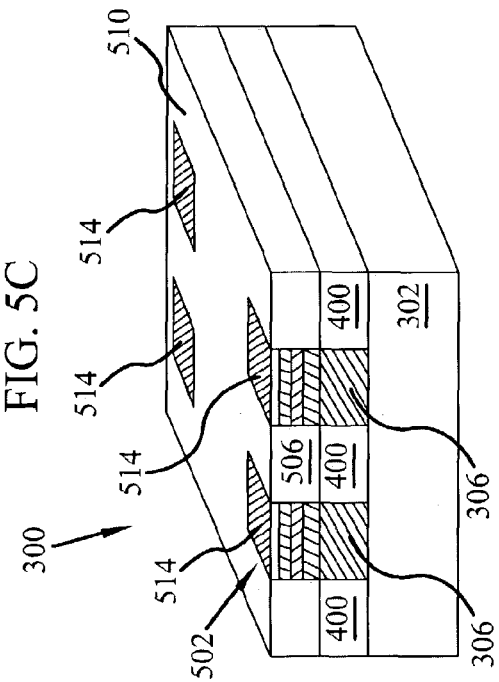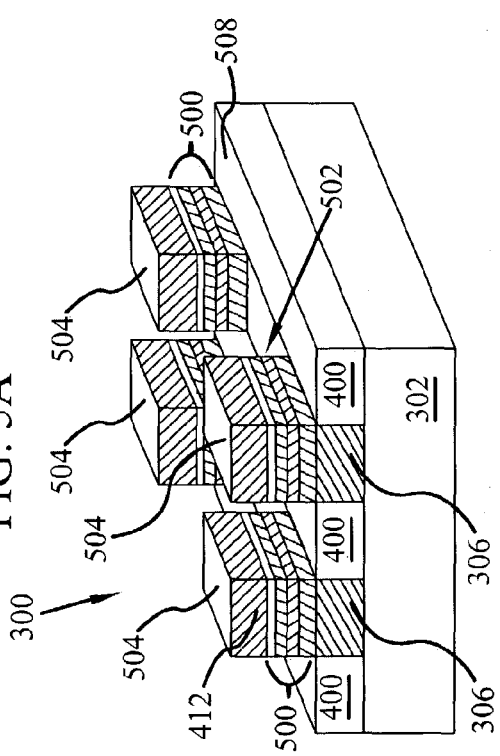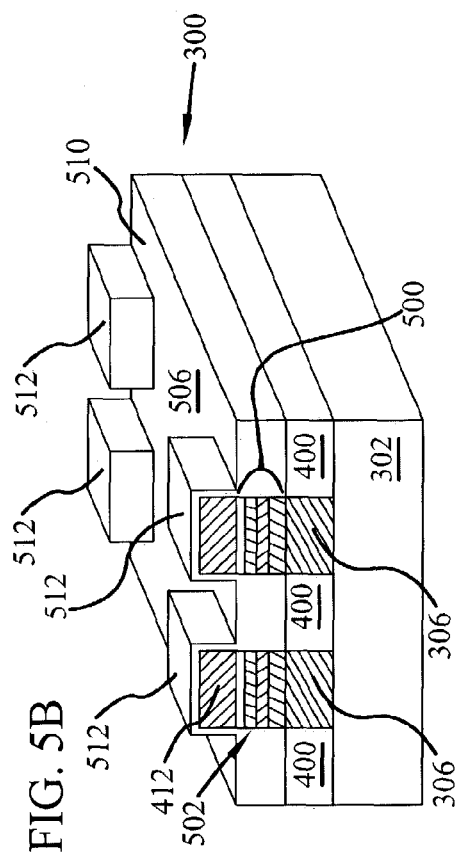

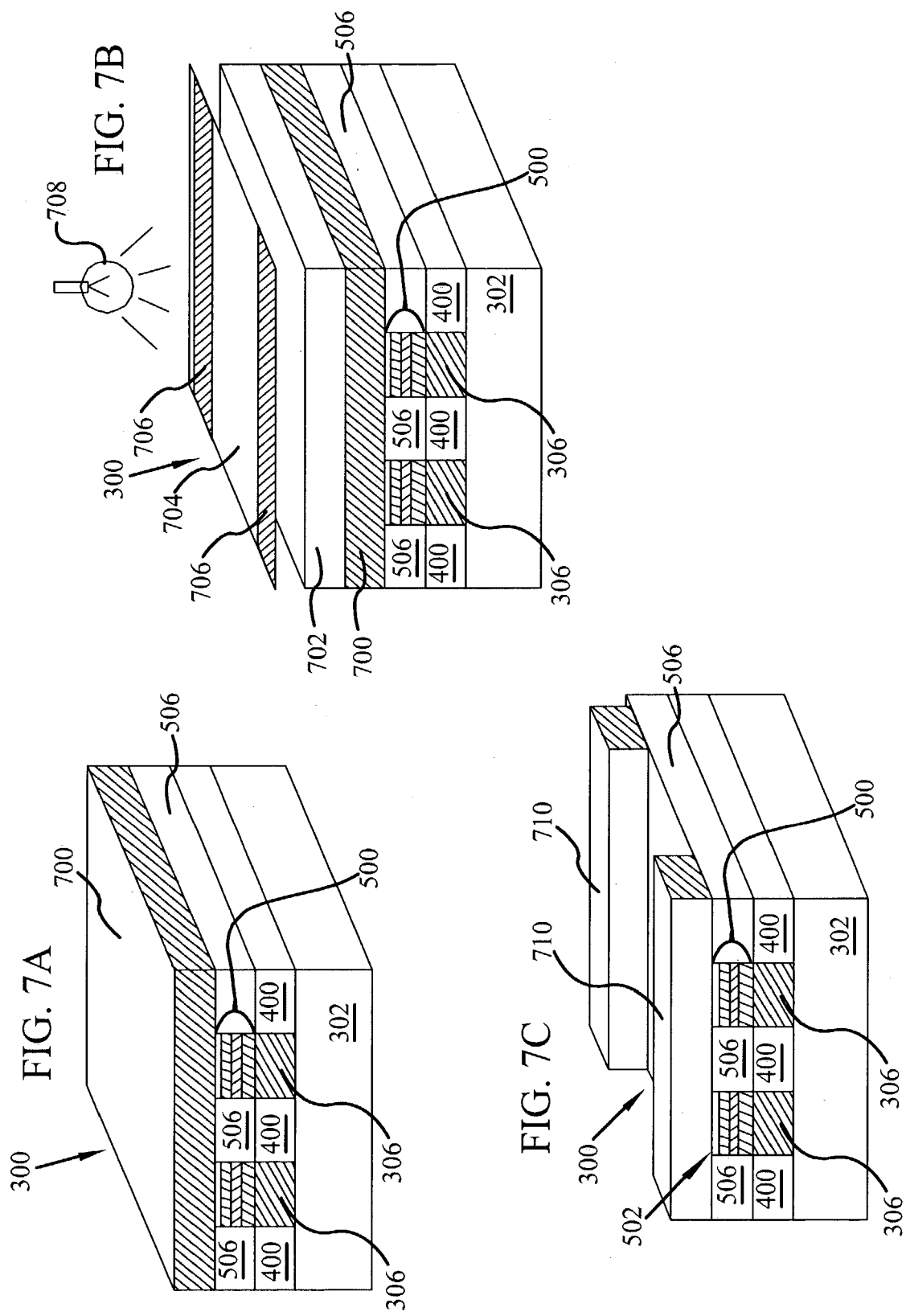

DIRECTIONAL ION ETCHING PROCESS FOR PATTERNING SELF-ALIGNED VIA CONTACTS

FIELD OF THE INVENTION

This invention relates generally to the manufacture of semiconductor devices such as high density magnetic random access memory (MRAM) structures, and in particular to an improved method of patterning self-aligned via contacts using directional low angle ion etching.

BACKGROUND OF THE INVENTION

In many of today's micro-electronics, smaller more compact sizing yields greater speed and processing power. Improved materials and precision in manufacturing permit greater resolutions in semiconductor manufacturing.

Generally speaking, semiconductors are manufactured through a layering process that provides two or more patterned conductive layers separated by intervening insulation layers. Considering the layers to be horizontally stacked, vertical points of contact between two or more conductive layers through the insulation layers are known as via structures, or more generally, via contacts. It is these via contacts that provide the wiring pattern for the integrated circuit.

Today's computer systems employ a variety of different types of semiconductors such as processors and memory. Increasing speed and sophistication of the systems is due in large part to reducing the size of the semiconductor components. For example, whereas 32 megabytes of memory was once considered large, contemporary computer systems may provide several gigabytes in substantially the same physical space.

With respect to memory structures, and specifically magnetic tunnel junction structures, the principle underlying the storage of data in the magnetic media is the ability to change, and or reverse, the relative orientation of magnetization of a storage data bit (i.e. the logic state of a "0" or a "1"). A prior art magnetic memory cell may be a tunneling magnetoresistance memory cell (TMR), a giant magnetoresistance memory cell (GMR), or a colossal magnetoresistance memory cell (CMR), each of which generally includes a data layer (also called a storage layer or bit layer), a reference layer, and an intermediate layer between the data layer and the reference layer.

It is this collection of layers defining the magnetic tunnel memory cell that are placed between two or more parallel conductive layers. The via contacts at the top of each magnetic tunnel memory permit the top conductor to provide electrical current to the memory cell.

Typically, the logic state (a "0" or a "1") of a magnetic memory cell depends on the relative orientations of magnetization in the data layer and the reference layer. For example, assuming proper contact with the via contacts at the top of the cell, when an electrical potential bias is applied across the data layer and the reference layer in a TMR cell, electrons migrate between the data layer and the reference layer through the intermediate layer. The intermediate layer is typically a thin dielectric layer commonly referred to as a tunnel barrier layer. The phenomena that cause the migration of electrons through the barrier layer may be-referred to as quantum mechanical tunneling or spin tunneling. The logic state may be determined by measuring the resistance of the memory cell.

Prior art methods to accomplish conductive vertical interconnections between layers of materials have generally followed one of two paths. In one, a physical hole is etched, as in drilled, through a non-conductive layer and subsequently filled with a conductive material. Such etching or drilling requires fine precision and control, for too much etching or drilling may damage, deplete or entirely remove the underlying layer to which the via contact is intended to contact. An alternative and potentially less risky method involves the use of undercutting masking structures, which upon removal may provide a via contact.

The prior art methods of semiconductor device manufacturing are typically based on photolithography. Generally speaking, a conductive layer of material is set down on a substrate. A photo-resist layer, also commonly know simply as a photoresist, or even resist, is then applied typically with a spin coating machine. A mask is then placed over the photoresist and light, typically UV light, is applied. During the process of exposure, the photoresist undergoes a chemical reaction. Generally the photoresist will react in one of two ways. With a positive photoresist UV light changes the chemical structure of the photoresist so that it is soluble in a developer. What "shows" therefore goes, and the mask provides an exact copy of the pattern which is to remain. A negative photoresist behaves in the opposite manner—UV exposure causes it to polymerize and therefore photoresist dissolving by the developer. As such the mask is a photographic negative of the pattern to be left.

FIGS. 1A through 2C illustrate the typical process involving the use of bi-layer resists to provide a photoresist undercut and subsequent via contacts. Shown in FIG. 1A is a portion of a magnetic memory structure 100 undergoing fabrication. The magnetic memory structure 100 is comprised of a substrate 102, row conductors 104, dielectric insulation 106, and the raw components of what will ultimately comprise the magnetic tunnel junction, for simplicity here referred to as the junction stack 108.

A first photoresist layer 110 is applied to the top of the junction stack 108 and a mask 112 is provided and light 116, typically UV, is provided. As the photoresist is a positive resist, the exposed area is made susceptible to decomposition upon contact with developer. In FIG. 1B, a second photoresist layer 120 is then applied atop the first photoresist layer 110 before the process of developing. A second mask 122 and additional light 116 are also provided. As can be seen, the masked areas 124 of the second mask 122 are larger than the mask areas 114 of the first mask 112.

By masking a larger area of the second photoresist 120 the resulting bi-layer of photoresist will provide an undercut stacked structure, akin to a photoresist mushroom 200, upon developing, as is shown in FIG. 2A. Each photoresist mushroom has an undercut portion 202 as a base and a cap 204. Etching is then performed upon the junction stack to create individual junction stacks 206 for each memory cell 208. A dielectric coating 220 is then applied over the exposed fabrication surface. As can be seen the dielectric coating 220 tends to coat exposed horizontal and exposed surfaces. The undercut portions 202 of the photoresist mushrooms 200 are generally not coated. A photoresist dissolving agent is then applied and the exposed undercut portions 202 of the photoresist mushrooms 200 are dissolved and the caps 204 washed away, leaving exposed via contacts 230 (see FIG. 2C).

To assist and further insure the undercutting process during development, resists with different development speeds may be used as well. More specifically the first photoresist 110 may develop faster then the second photoresist 120, thus the first photoresist 110 dissolves away more quickly then the second photoresist 120. In yet another traditional undercutting bi-layer photoresist process, photoresists requiring different developing agents may be used. In such an instance the two photoresist layers 110 and 120 are applied and one mask 122 may be used. The photoresists 120 and 110 are then developed with their respective developers. The undercut of photoresist 110 is achieved by over or under developing photoresist layer 110, depending on the type of photoresist utilized.

The process of creating the undercut photoresist mushrooms 200 whether by multiple masking, by using resists of different developing speeds, or a combination of both masking and different developing speeds is complex, time consuming and difficult. As the size of the memory cells 208 may be on the scale of nanometers, there is little margin for error. If the undercut portion 202 fails to form properly the memory cell 208 may be nonfunctional. In addition, if the dielectric coating 220 is applied too thick, it may bridge over the undercut portions 202 and shield them from the dissolving agent, thus preventing the exposure of the via contact 230. Also, as the undercut portion 202 is smaller than the shielding cap 204, the via contact 230 ultimately provided is by some degree smaller than the top of the memory cell 208 and does not provide the maximum contact area possible. Therefore, the maximum density of memory cells provided by an undercut process is limited by the size of the via contact 230 and the complexities of the bi-layer undercut process, rather than the size of the individual junction stack 206 or the limitations of the photolithography process. Further, during the process of washing away the solid coated caps 204, it is possible that as they are solid structures they may collide with memory cells 208 damaging them immediately, or making them susceptible to premature failure.

Hence, there is a need for a method of providing via contacts during semiconductor fabrication, and in particular magnetic memory cells, which overcomes one or more of the drawbacks identified above. The present invention satisfies one or more of these needs.

SUMMARY OF THE INVENTION

The invention provides a directional ion etching process to pattern self-aligned via contacts in the manufacture of semiconductor devices such as high density magnetic random access memory (MRAM).

In particular, and by way of example only, according to an embodiment of the present invention, this invention provides a directional ion etching process for patterning self-aligned via contacts including: depositing a photoresist on a patterned layer; masking the photoresist to provide at least one protected area, the photoresist being developed to remove the photoresist from the non-protected area; depositing a dielectric coating upon the patterned layer and the remaining photoresist; and ion etching at a low angle relative to the patterned layer to remove the dielectric coated photoresist, the removal of the photoresist thereby providing at least one self-aligned via contact.

Moreover, according to an embodiment thereof, the invention may provide a directional ion etching process for patterning self-aligned via contacts, including: depositing a first conductive layer on a wafer substrate; depositing a junction layer upon the first conductive layer, the junction layer being in electrical contact with the conductive layer; depositing a photoresist upon the junction layer; masking the photoresist to provide a plurality of junction stacks, the photoresist being developed and the exposed junction layer being etched; depositing a dielectric coating upon the etching exposed surfaces and the photoresist; and ion etching at a low angle relative to the wafer substrate to remove the dielectric coated photoresist, the removal of the photoresist thereby providing at least one self-aligned via contact.

In yet another embodiment, the invention may provide a directional ion etching process for patterning self-aligned via contacts including: depositing a first conductive layer upon a wafer substrate; depositing a first photoresist layer on the first conductive layer; masking the first photoresist layer to provide conductive rows, the photoresist being developed, the exposed conductive layer being etched and the remaining photoresist being dissolved to expose the conductive rows; depositing a first dielectric to insulate the conductive rows, the first dielectric being planarized to expose the top of the conductive rows; depositing a junction layer upon the planarized dielectric, the junction layer being in electrical contact with the conductive rows; depositing a second photoresist upon the junction layer; masking the second photoresist to provide a plurality of junction stacks, the second photoresist being developed and the exposed junction layer being etched; depositing a second dielectric to coat the etching exposed surfaces and the second photoresist; and ion etching at a low angle relative to the wafer substrate to remove the dielectric coated second photoresist, the removal of the second photoresist thereby providing at least one self-aligned via contact.

These and other features and advantages of the preferred apparatus and method will become apparent from the following detailed description taken in conjunction with the accompanying drawings which illustrate, by way of example the principles of the invention.

BRIEF DESCRIPTION OF THE DRAWINGS

FIGS. 4A~4C provide a perspective view illustrating the application and patterning of a material layers and a photoresist of the memory structure shown in FIG. 3D;

FIGS. 5A~5C provide a perspective view illustrating the structures and resulting aligned via contacts of the memory structure shown in FIG. 4C;

FIGS. 7A~7B provide a perspective view illustrating the addition of column conductors to the memory structure shown in FIG. 5C.

DETAILED DESCRIPTION

Figure 1A:
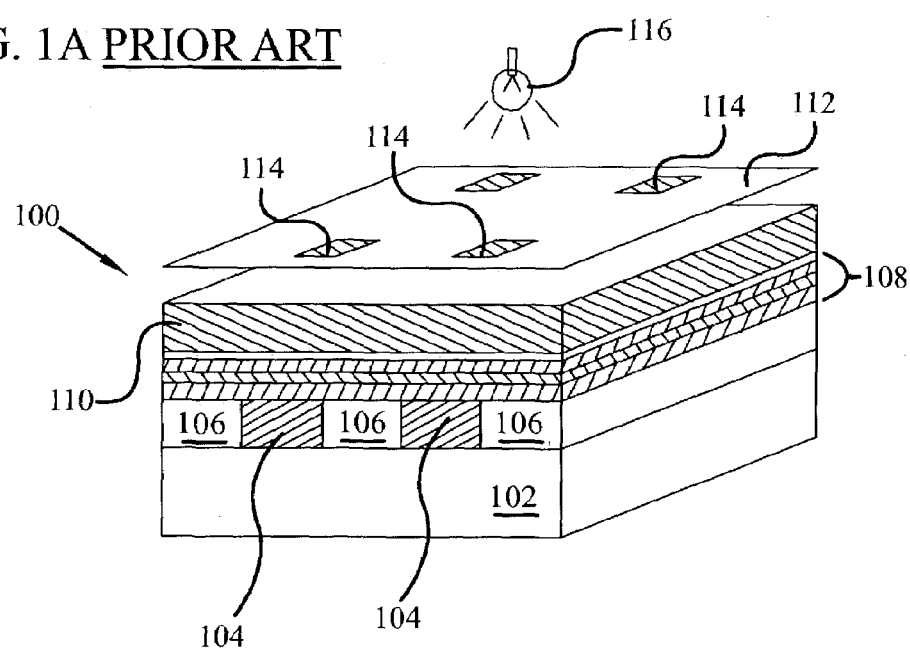
FIGS. 1A~1B provide a perspective view of a prior art memory structure undergoing fabrication, illustrating the application of bi-layer photoresists.
Figure 1B:
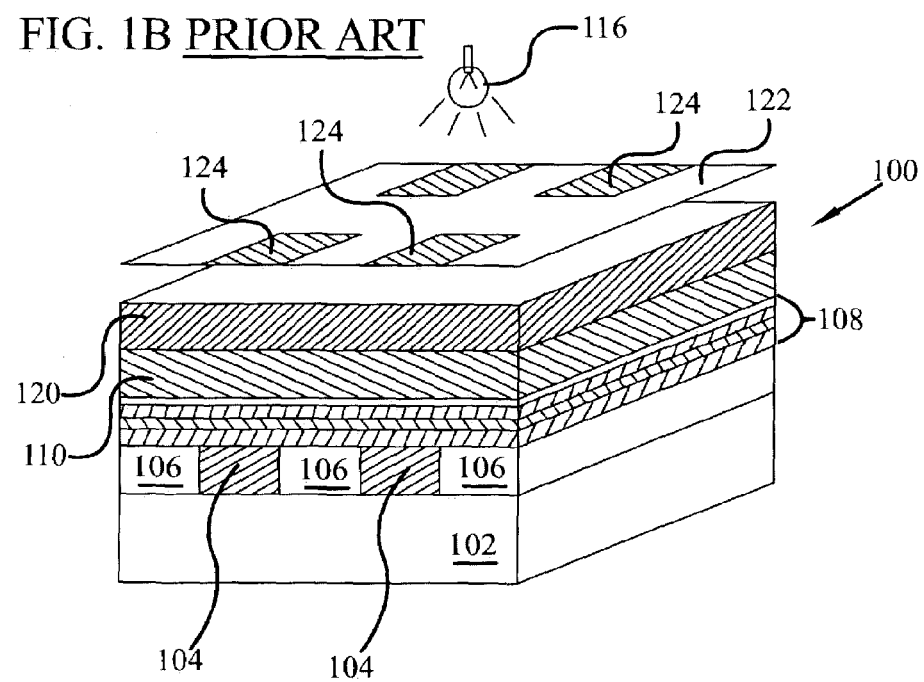
Figure 2A:
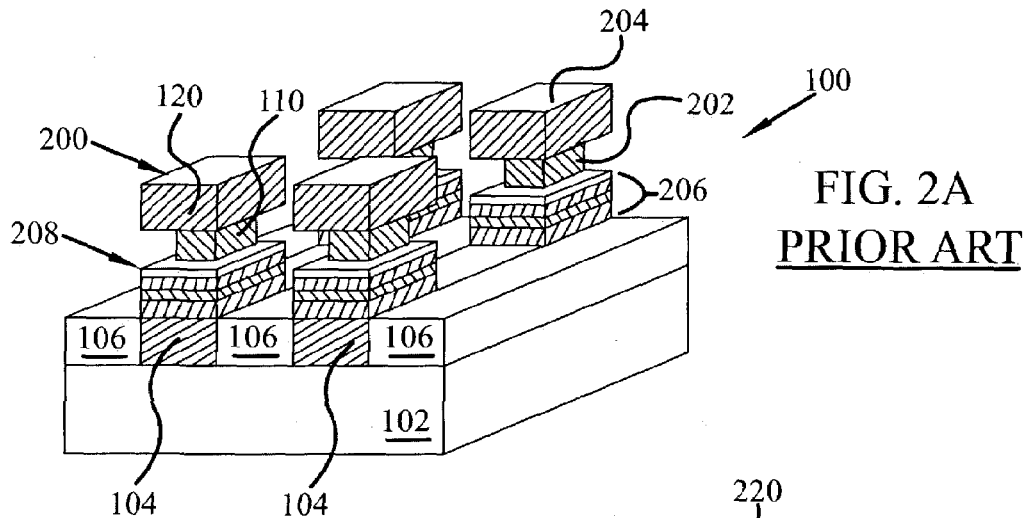
FIGS. 2A~2B provide a perspective view illustrating the photoresist undercut process of the prior art memory structure shown in FIGS. 1A & 1B.
Figure 2B:
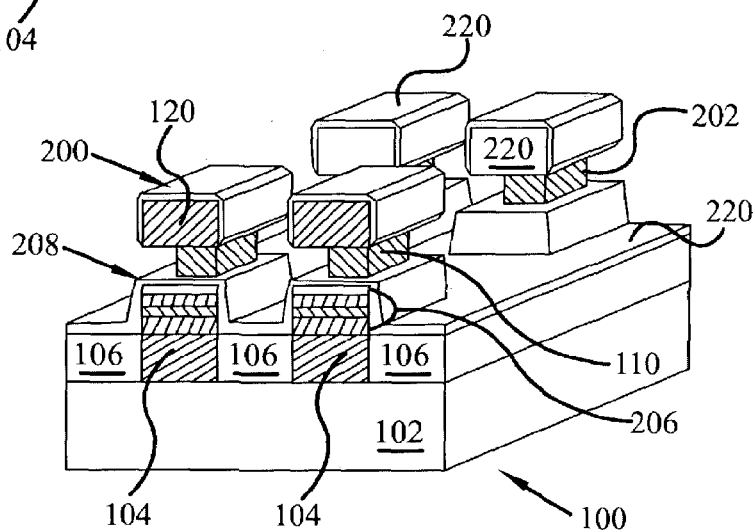
Figure 2C:
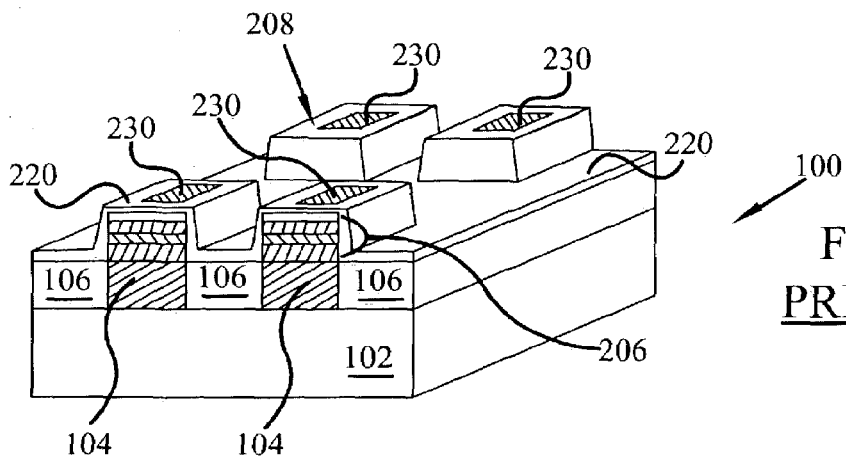

Before proceeding with the detailed description, it is to be appreciated that the present invention is not limited to use or application in conjunction with a specific type of semiconductor fabrication. Thus, although the present invention is, for the convenience of explanation, depicted and described with respect to typical exemplary embodiments relating to magnetic tunnel junction memory such as may be used for magnetic random access memory (MRAM), it will be appreciated that this invention may be applied with other types of semiconductor fabrication where self-aligned via contacts are desired.

Referring now to the drawings, FIGS. 3A through 5D conceptually illustrate a process of providing self-aligned via contacts in the fabrication of magnetic tunnel junction memory 300 according to an embodiment of the present invention. It will be appreciated that the described process need not be performed in the order in which it is herein described, but that this description is merely exemplary of one preferred method of fabricating magnetic memory 300 with self-aligned via contacts in accordance with the present invention.

In at least one embodiment the fabrication process may be commenced upon a substrate wafer 302. Typically, the wafer 302 is chemically cleaned to remove any particulate matter, organic, ionic, and or metallic impurities or debris which may be present upon the surface of the wafer 302. A first conductive layer 304 is deposited or otherwise applied upon the substrate wafer 302 to a substantially uniform thickness. The depositing of the conductive layer 304 may be by sputtering, ion beam deposition, electron beam evaporation, or such other appropriate method.

In certain applications, such as mass storage, magnetic memory cells may be joined to a common connector. Access of a particular memory cell may then be accomplished by use of an articulating nanoprobe that provides a second conductor to the top of a magnetic memory cell. In applications requiring faster memory access, such as main memory random access, it is more common place to access a particular memory cell by the use of transverse row and column conductors directly contacting the top and bottom of a given cell. In at least one embodiment, the process of photolithography may be used to provide conductive rows 306 (see FIG. 3D).

Figure 3C:
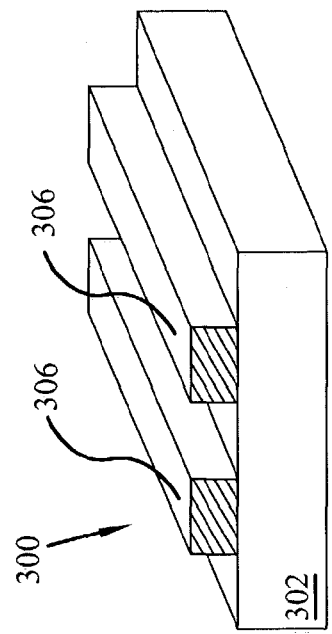
FIGS. 3A~3D provide a perspective view illustrating the fabrication of a memory structure according to an embodiment of the present invention.
Figure 3D:
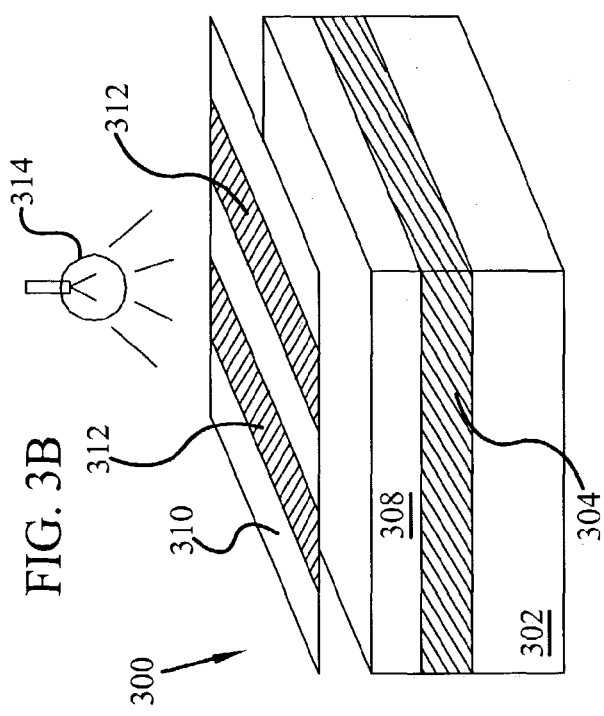
Figure 3A:
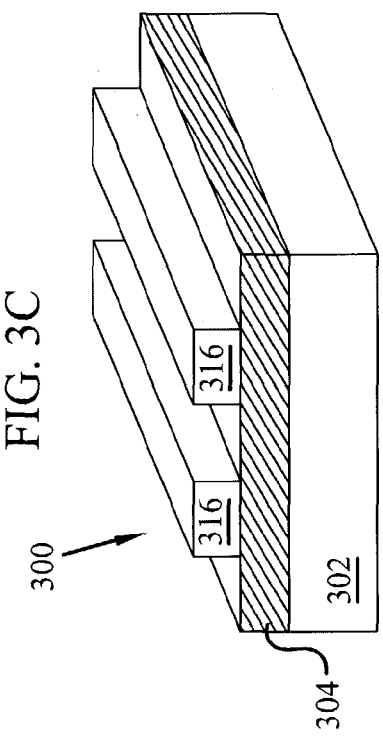
Figure 3B:
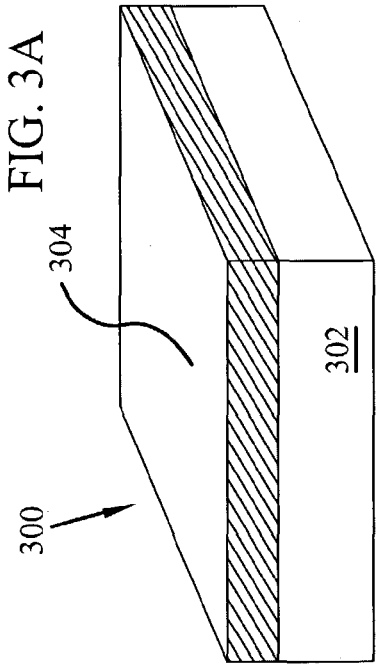

As shown in FIG. 3B, a layer of photoresist 308 is applied upon the first conductor layer 304. In at least one embodiment the photoresist 308 is a positive photoresist. Application of the photoresist may be by the technique commonly known as "spin coating." Briefly stated, the wafer 302 is placed in a high-speed centrifuge also providing a vacuum environment. Rotated at a speed of between 3000 to 6000 RPM a small quantity of photoresist is deposited at the center of the spinning wafer. The rotation causes the photoresist to spread out across the waver 302 in a substantially uniform thickness. Generally the wafer is then baked gently in an oven to evaporate the photoresist solvents and partially solidify the photoresist.

A photo mask is created by known photographic methods upon a glass substrate, thus providing a mask 310. The mask is aligned with the wafer 302 so that the pattern 312 may be transferred on to the surface of the photoresist 308. Following alignment of the mask 310, the photoresist is exposed through the pattern 312 on the mask 310 with a high intensity light 314. The wavelength of the light used is dependent upon the resolution of the structures to be produced upon the wafer. The light may be visible light, ultraviolet (UV), deep-UV (DUV), extreme-UV (EUV), or even X-ray. There are generally understood to be three primary methods of exposure: contact, where the mask 310 is placed in direct contact with the surface of the photoresist 308; proximity, where the mask 310 is placed in close proximity, 10 to 25 microns, to the photoresist; and projection, where the mask is projected upon the photoresist from a greater distance. Such projection exposure may be desired as it reduces the possible damage to the mask 310 from contact or proximity exposure, and more significantly permits very small resolution allowing for nanometer scaled production work.

With a positive resist, the exposed portions of photoresist 308 become soluble to a developer. As shown in FIGS. 3C and 3D, developing the wafer 302 provides templates for conductive rows. Generally, the wafer may be baked to harden the patterned photoresist 316. The top surface of the wafer 302 is then etched such that the exposed portions of the conductive layer 304 are removed while the portions hidden beneath the patterned photoresist 316 remain. The wafer 302 may then be washed with a photoresist dissolving agent such that substantially all of the photoresist is removed and conductive rows 306 remain.

A dielectric coating 400 may be deposited, effectively insulating conductive rows 306 as is shown in FIG. 4A. Suitable dielectric materials for the dielectric coating 400 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

Deposition of the dielectric coating 400 may be accomplished by method common to semiconductor layering, specifically for example thermal oxidation, sputtering, spin-on-glass coating or such other well known deposition process. To provide electrical connectivity to the tops of the conductive rows 306, the technique of chemical and mechanical polishing planarization (CMP planarization) may be performed. Deposition of a patterned layer, such as the junction layer 402, is then performed upon the exposed conductive rows 306 and planarized dielectric coating 400, see FIG. 4B. Deposition of the patterned/junction layer 402 may be accomplished by appropriate means for the type of material or materials comprising the patterned/junction layer 402. Under appropriate circumstances the patterned layer may be vertically patterned as in a magnetic tunnel junction, or may be horizontally patterned by other lithography processes.

For the fabrication of magnetic tunnel junction memory cells, the junction layer 402 may be comprised of a ferromagnetic data layer 404, an intermediate barrier layer 406, a reference layer 408, and a cap layer 410. The cap layer 410 may be provided to protect the top of the magnetic tunnel junction from oxidation when exposed to the atmosphere during the fabrication process. The reference layer 408 may be a pinned or soft reference layer. Under appropriate circumstances such as where a self-aligned via contact is desired In at least one embodiment, the intermediate layer 406 is a tunnel layer made from an electrically insulating material (a dielectric) that separates and electrically isolates the data layer 404 from the reference layer 408. Suitable dielectric materials for the dielectric intermediate layer 406 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

In at least one other embodiment, the intermediate layer 406 is a tunnel layer made from a non-magnetic material such as a 3d, a 4d, or a 5d transition metal listed in the periodic table of the elements. Suitable non-magnetic materials for a non-magnetic intermediate layer 406 may include, but are not limited to: Copper (Cu), Gold (Au) and Silver (Ag). While the actual thickness of the intermediate layer 406 is dependent upon the materials selected to create the intermediate layer 406 and the type of tunnel memory cell desired, in general, the intermediate layer 406 may have a thickness of about 0.5 nm to about 5.0 nm.

A photoresist 412 is then deposited upon the junction layer 402 by appropriate methods. The photoresist 412 is then masked, exposed, and developed as described above with respect to FIGS. 3B and 3C. As shown in FIG. 4C, mask 414 provides a plurality of masked areas 416, patterned to define the locations of junction stacks 500 for each magnetic memory cell 502 (see FIG. 5A). More specifically, the mask 414 defines at least one protected area upon the junction layer 402. The protection is provided by the photoresist 412 as indicated by the mask 414. Mask 414 aligns masked areas 416 to be in perpendicular alignment with conductive rows 306.

The developing process removes the soluble portions of the photoresist 412, from the non-protected areas, and results in remaining photoresist caps 504 patterned to protect areas of the junction layer 402. To establish the magnetic tunnel junction stacks 500 shown in FIG. 5A, etching by appropriate means may be performed to remove the junction layer material from the non-protected areas. As is shown, each of the remaining junction stacks 500 is self-aligned with a respective conductor row 306. Following the etching process to create junction stacks 500, the photoresist caps 504 are not dissolved.

Illustrated in FIG. 5B, a dielectric 506 is then deposited by appropriate means upon substantially all of the exposed surface 508 and the photoresist caps 504 shown in FIG. 5A, resulting in coated caps 512. The dielectric may be of substantially the same material as may be used for the intermediate layer 406 or the first dielectric 400 deposited to insulate rows 306. As conceptually shown in FIG. 5B the dielectric 506 may be applied to a thickness that is substantially equivalent to the height of the junction stacks 500. It is also appreciated that the coated caps 512 extend substantially perpendicularly from the coated surface 510 of the wafer 302. Whereas in the prior art the undercut process attempts to provide shadowed areas where the dielectric will not adhere, the present invention advantageously avoids such a shadowing attempt.

Figure 6A:
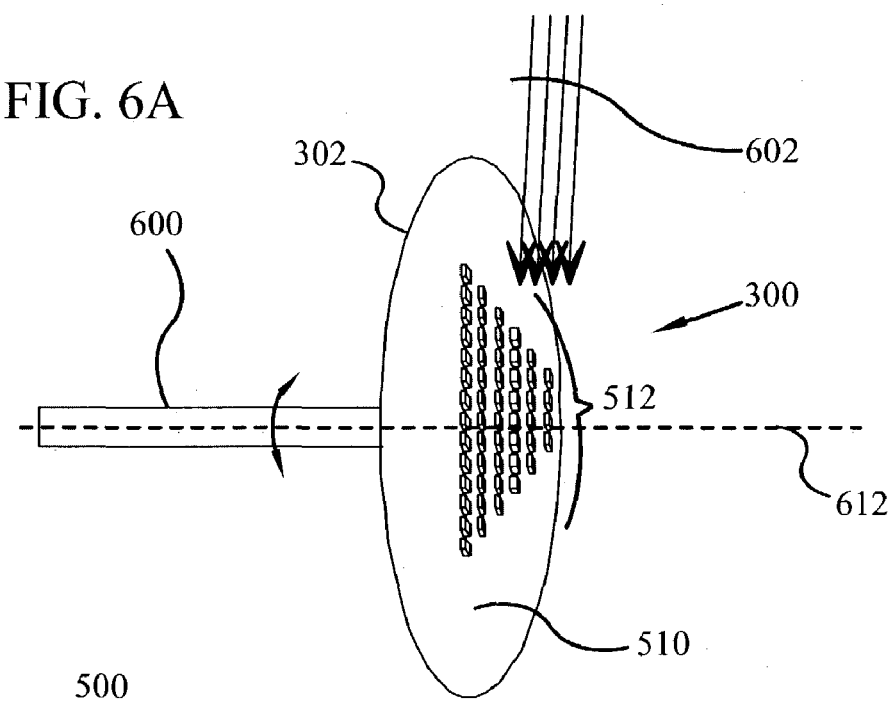
FIGS. 6A~6B provide a perspective view illustrating the low angle ion etching process providing the aligned via contacts of the memory structure shown in FIG. 5C.
Figure 6B:
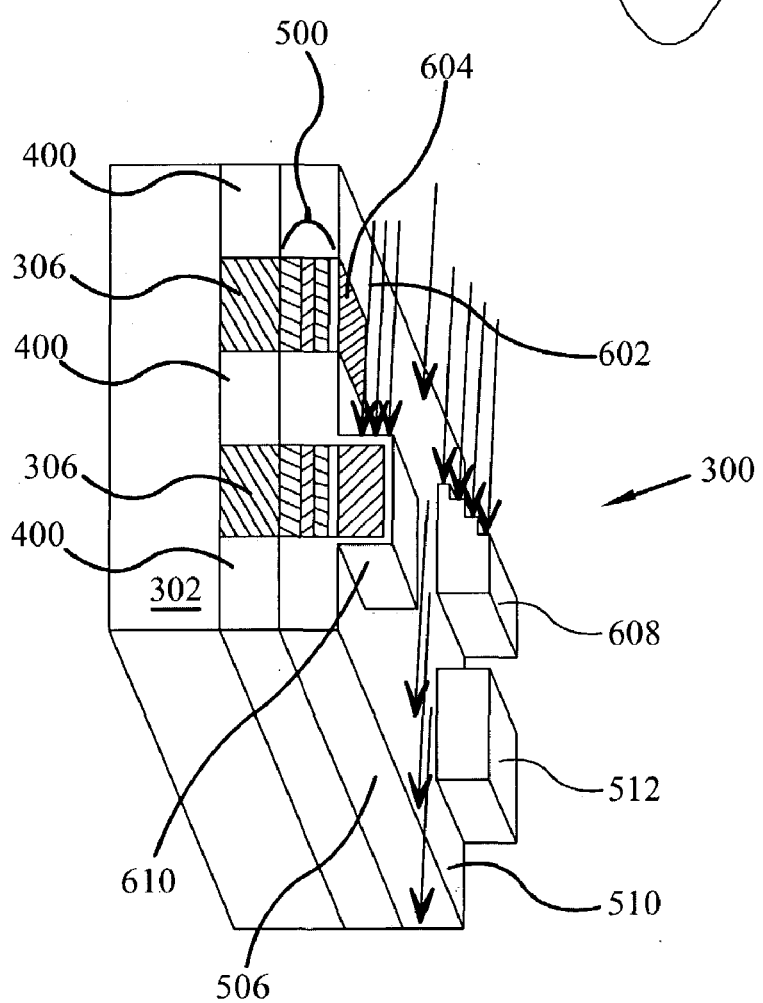

The patterned self-aligned via contacts 514 shown in FIG. 5C are achieved by low angle ion etching, as is illustrated in FIGS. 6A and 6B. Specifically, in at least one embodiment, the wafer 302 is mounted on a spindle 600 such that the wafer may be rotated about a center axis 612 perpendicular to the surface 510 of the wafer 302. The wafer 302 is then rotated in a stream of directed ions, represented by arrows 602. The ion stream 602 is provided at a substantially low angle of attack relative to the surface 510 of the wafer 302. As such the coated caps 512, and substantially only the coated caps 512, are milled away to achieve the self-aligned via contacts 514 shown in FIG. 5C. As can be seen in FIG. 6B, an enlarged portion of the wafer 302 illustrated in FIG. 6A, one cap has been milled away to expose via contact 510. Coated cap 608 has been partially milled, and milling is about to commence on coated cap 610.

While controlling the direction of ion stream 602 is fairly simple, controlling the depth of an ion etching operation can be difficult, often resulting in either a complete punch through or an insufficient removal of material. In addition, different ion beam intensities are often required for different materials. When the layering of the materials is imprecise, milling too quickly through a "hard" material may inadvertently damage a "soft" material located below the "hard" material.

By utilizing a low angle of attack, the issue of controlling the depth of the ion etching process is advantageously minimized, if not otherwise eliminated. More specifically, substantially all protruding materials placed in the ion stream 602 will be removed. Understanding that all materials placed in the ion stream are to be removed, systems and costly equipment otherwise required to assist with controlling the depth of etching may be avoided. As the wafer 302 may be rotated in the ion stream 602 as described, the milling affect is applied to all sides of the coated caps 512. By controlling the intensity of the ion stream 602 and the duration of time the coated caps 512 are exposed to the ion stream 602, the operator is able to achieve substantially all self-aligned via contacts 604 (514 as shown in FIG. 5C) with minimal risk to the remaining structures of the wafer 302. In addition, the top of exposed via contact 604 advantageously may be substantially in the same plane as surface 510, without additional conductive filler material being required.

It is generally understood that an ion etching process may be accomplished either of two traditional processes, a physical process or an assisted physical process. In a physical etching environment no chemical agent is provided. Rather, the removal of material is entirely dependent upon the physical impact of the ions knocking atoms off the material surface by physical force alone. Physical ion etching is commonly referred to as ion milling or ion beam etching. In at least one embodiment, the ion etching to remove the coated caps 512 is by a physical ion etching process.

As an alternative to physical etching, under appropriate circumstances an assisted physical process, such as reactive ion etching process may be employed. In a reactive ion etching process, or RIE, removal of material comes as a combined result of chemical reactions and physical impact. Generally the ions are accelerated by a voltage applied in a vacuum. The affect of their impact is aided by the introduction of a chemical which reacts with the surface of the semiconductor being etched. The reaction makes the surface softer and as such increases the etching rate. In at least one embodiment, the ion etching to remove the coated caps 512 is by an assisted physical process such as RIE. The type of directed ions used for both methods, and the type of chemical(s) assistant in REI, may very depending upon the nature of the material being removed.

In at least one embodiment, the ion stream 602 may be substantially parallel to the plane of the surface 510 of the wafer 302. Under appropriate circumstances, such as for different contour patters of structures on the surface 510, the angle of attack may be an acute angle to surface 510. An acute angle is understood and appreciated as less than II/2 radians (90 degrees). Moreover, the via contacts 514 are exposed by substantially acute angle milling and not by substantially perpendicular etching. In addition, low angle ion etching implies that the ion stream 602 strikes the side surfaces of the coated caps 512 at substantially a head on alignment, thus milling the contacted surface. In contrast, should the ion stream 602 contact the surface 510 of wafer 302, such contact is at such a low angle that the ion stream 602 is more likely to glance off the surface 510 then significantly mill the surface 510. In other words, the low angle of ion etching relative to surface 510 is a high angle relative to the extending coated caps 512, 608 and 610.

In at least one embodiment the coated caps 512 are the materials substantially placed in the ion stream 602. Under appropriate circumstances, following the ion etching process, the wafer 302 may be washed with a photoresist dissolving agent or other process to insure that substantially all remaining portions of the coated caps 512 have been removed.

This low angle ion etching provides an advantageous alternative to the undercut bi-layer resist process traditionally used in achieving self-aligned via contacts. As no bi-layer photoresist is created, fewer photoresist layers may be used, fewer developer issues are involved, and fewer processing steps may be employed. Whereas the bi-layer resist operation generally necessitates that the self-aligned contact is smaller than the top of each memory cell, as the un-coated photoresist caps 504 were used to form the respective junction stacks 500 as shown in FIG. 5A, the exposed self-aligned via contacts 514 are advantageously substantially the same size in surface area as the top of each magnetic memory cell 502.

Low angle ion etching therefore permits the fabrication of semiconductors with self-aligned via contacts 514 at smaller resolutions than may be achieved with traditional undercut bi-layer photoresist processes. More specifically, low angle ion etching permits the density of self-aligned via contacts to be limited by the resolutions of the photolithography process rather than by the bi-layer undercut process. Under appropriate circumstances, such as a the fabrication of a semiconductor structure requiring additional self-aligned via contacts between additional layers, the above described photoresist application, pattern masking, developing, coating and low angle ion etching process may be repeated.

To complete the general fabrication process of magnetic memory 300 in a cross-point array, such as is typical for use in main memory applications, a conductive layer may be deposited over the exposed via contacts. In a process that may be substantially similar to that described with respect to FIGS. 3A through 3D, conductive columns, substantially transverse to conductive rows 306 may be provided as illustrated in FIGS. 7A through 7C. More specifically, a conductive layer 700 is deposited upon the exposed surface 510 of the wafer 302, thereby contacting each of the patterned self-aligned via contacts 514 (see FIG. 5C). As shown in FIG. 7B, a photoresist layer 702 is then deposited by appropriate means upon the conductive layer 700. A mask 704 with masked areas 706, aligned appropriately to the now covered via contacts 514 is provided. Light 708 exposes photoresist 702 through the mask 704, and the photoresist is developed as described above. The exposed portions of conductive layer 700 are then etched by appropriate means such that the portions of the conductive layer 700 not protected by the patterned photoresist 702 are removed. As shown in FIG. 7C, the remaining photoresist is then dissolved or otherwise removed such that conductive columns 710 remain, each of which is in appropriate contact with the self-aligned via contacts 514 provided at the top of each magnetic memory cell 502. The resulting cross-point magnetic memory array is suitable for such applications as magnetic random access memory (MRAM) or other cross-point magnetic memory array applications.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

I claim:

1. A directional ion etching process for patterning self-aligned via contacts comprising:
   depositing a photoresist on a patterned layer;
   masking the photoresist to provide at least one protected area, the photoresist being developed to remove the photoresist from the non-protected area;
   depositing a dielectric coating upon the patterned layer and the remaining photoresist; and
   ion etching at a low angle relative to the patterned layer to remove the dielectric coated photoresist, the removal of the photoresist thereby providing at least one self-aligned via contact.

2. The process of claim 1, wherein the ion etching is accomplished by a physical ion etching.

3. The process of claim 1, wherein the ion etching is accomplished by a physically assisted process.

4. The process of claim 3, wherein the physically assisted process is reactive ion etching.

5. The process of claim 1, wherein the patterned layer is a magnetic tunnel junction layer.

6. The process of claim 1, further including etching the patterned layer following the developing of the photoresist and prior to the depositing of the dielectric coating.

7. The process of claim 1, wherein the protected area is the intended location of at least one self-aligned via contact.

8. The process of claim 1, wherein the dielectric coated photoresists extend substantially perpendicularly from the surface of the patterned layer, such that the low angle of ion etching relative to the patterned layer is a high angle relative to the extending coated photoresists.

9. The process of claim 1, wherein the via contact exposed by ion etching is in substantially the same plane as the remaining dielectric.

10. The process of claim 1, further including depositing an additional patterned layer and repeating the recited process to establish at least one additional self-aligned contact to the additional patterned layer.

11. The process of claim 10, wherein the additional patterned layer is a conductive layer.

12. A directional ion etching process for patterning self-aligned via contacts, comprising:
   depositing a first conductive layer on a wafer substrate;
   depositing a junction layer upon the first conductive layer, the junction layer being in electrical contact with the first conductive layer;
   depositing a photoresist upon the junction layer;
   masking the photoresist to provide a plurality of junction stacks, the photoresist being developed and the exposed junction layer being etched;
   depositing a dielectric coating upon the etching exposed surfaces and the photoresist; and
   ion etching at a low angle relative to the wafer substrate to remove the dielectric coated photoresist, the removal of the photoresist thereby providing at least one self-aligned via contact.

13. The process of claim 12, further including:
   depositing a first photoresist layer on the first conductive layer;
   masking the first photoresist layer to provide conductive rows, the photoresist being developed, the exposed conductive layer being etched and the remaining photoresist being dissolved to expose the conductive rows;

depositing a first dielectric to insulate the conductive rows, the first dielectric being planarized to expose the top of the conductive rows before the junction layer is deposited.

14. The process of claim 12, wherein the dielectric coating applied to the etching exposed surfaces results in a surface substantially parallel to the wafer substrate, the coated photoresist extending substantially perpendicularly to the wafer substrate, such that the low angle of ion etching relative to the wafer substrate is a high angle relative to the extending coated photoresist.

15. The process of claim 14, wherein the via contact exposed by ion etching is in substantially the same plane as the surface substantially parallel to the wafer substrate.

16. The process of claim 12, wherein the ion etching is accomplished by a physical ion etching.

17. The process of claim 12, wherein the ion etching is accomplished by a physically assisted process.

18. The process of claim 17, wherein the physically assisted process is reactive ion etching.

19. The process of claim 12, wherein the junction stack is a magnetic tunnel junction stack.

20. The process of claim 19, wherein the junction stack comprises a ferromagnetic data layer characterized by an alterable orientation of magnetization, an intermediate layer in contact with the data layer, and a ferromagnetic reference layer in contact with the intermediate layer, opposite from the data layer.

21. The process of claim 12, wherein the self-aligned contacts occur on magnetic memory for use in probe based memory storage systems.

22. The process of claim 12, further including:
depositing an additional patterned layer upon the exposed at least one via contact;
depositing an additional photoresist on the additional patterned layer;
masking the additional photoresist to provide at least one protected area, the additional photoresist being developed to remove the additional photoresist from the non-protected area;
depositing an additional dielectric coating upon the additional patterned layer and the remaining additional photoresist; and
ion etching at a low angle relative to the additional patterned layer to remove the dielectric coated additional photoresist, the removal of the additional photoresist thereby providing at least one self-aligned via contact to the additional patterned layer.

23. The process of claim 22, wherein the additional patterned layer is a conductive layer.

24. A directional ion etching process for patterning self-aligned via contacts comprising:
depositing a first conductive layer upon a wafer substrate;
depositing a first photoresist layer on the first conductive layer;
masking the first photoresist layer to provide conductive rows, the photoresist being developed, the exposed conductive layer being etched and the remaining photoresist being dissolved to expose the conductive rows;
depositing a first dielectric to insulate the conductive rows, the first dielectric being planarized to expose the top of the conductive rows;
depositing a junction layer upon the planarized dielectric, the junction layer being in electrical contact with the conductive rows;
depositing a second photoresist upon the junction layer;
masking the second photoresist to provide a plurality of junction stacks, the second photoresist being developed and the exposed junction layer being etched;
depositing a second dielectric to coat the etching exposed surfaces and the second photoresist; and
ion etching at a low angle relative to the wafer substrate to remove the dielectric coated second photoresist, the removal of the second photoresist thereby providing at least one self-aligned via contact.

25. The process of claim 24, wherein the ion etching is accomplished by a physical ion etching.

26. The process of claim 24, wherein the ion etching is accomplished by a physically assisted process.

27. The process of claim 26, wherein the physically assisted process is reactive ion etching.

28. The process of claim 24, wherein the junction stack is a magnetic tunnel junction stack.

29. The process of claim 28, wherein the junction stack comprises, a ferromagnetic data layer characterized by an alterable orientation of magnetization, an intermediate layer in contact with the data layer, and a ferromagnetic reference layer in contact with the intermediate layer, opposite from the data layer.

30. The process of claim 24, wherein the first dielectric is planarized by CMP planarization.

31. The process of claim 24, wherein the second dielectric coating applied to the etching exposed surfaces results in a surface substantially parallel to the wafer substrate, the coated second photoresist extending substantially perpendicularly to the wafer substrate, such that the low angle of ion etching relative to the wafer substrate is a high angle relative to the extending coated second photoresist.

32. The process of claim 24, wherein the thickness of the second dielectric coating is substantially the height of the junction stacks, such that the top surface of the dielectric coating is in substantially the same plane as the top of the junction stacks.

33. The process of claim 24, wherein the via contact exposed by ion etching is in substantially the same plane as the surface substantially parallel to the wafer substrate.

34. The process of claim 24, wherein the self-aligned contacts occur on magnetic memory for use in probe based memory storage systems.

35. The process of claim 24, further including:
depositing a second conductive layer upon the exposed via contacts;
depositing a third photoresist layer on the second conductive layer; and
masking the third photoresist layer to provide conductive columns transverse to the conductive rows, the third photoresist being developed, the exposed second conductive layer being etched and the remaining third photoresist being dissolved to expose the conductive columns.

36. The process of claim 35, wherein the self-aligned contacts occur on magnetic memory for use in cross-point magnetic memory array applications.

37. The process of claim 24, further including:
depositing an additional patterned layer upon the exposed at least one via contact;
depositing an additional photoresist on the additional patterned layer;
masking the additional photoresist to provide at least one protected area, the additional photoresist being developed to remove the additional photoresist from the non-protected area;

depositing an additional dielectric coating upon the additional patterned layer and the remaining additional photoresist; and ion etching at a low angle relative to the additional patterned layer to remove the dielectric coated additional photoresist, the removal of the additional photoresist thereby providing at least one self-aligned via contact to the additional patterned layer.

38. The process of claim 37, wherein the additional patterned layer is a conductive layer.

* * * * *